(12) United States Patent
Zhao

(10) Patent No.: US 11,380,649 B2
(45) Date of Patent: Jul. 5, 2022

(54) FAN-OUT WAFER-LEVEL PACKAGING STRUCTURE AND METHOD PACKAGING THE SAME

(71) Applicant: SJ SEMICONDUCTOR (JIANGYIN) CORPORATION, JiangYin (CN)

(72) Inventor: Hailin Zhao, JiangYin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 0 days.

(21) Appl. No.: 17/207,368

(22) Filed: Mar. 19, 2021

(65) Prior Publication Data

US 2022/0077107 A1    Mar. 10, 2022

(30) Foreign Application Priority Data

Sep. 8, 2020 (CN) .......................... 202010936915.9
Sep. 8, 2020 (CN) .......................... 202021943526.0

(51) Int. Cl.
*H01L 23/00* (2006.01)
*H01L 21/56* (2006.01)

(52) U.S. Cl.
CPC ............ *H01L 24/96* (2013.01); *H01L 21/561* (2013.01); *H01L 24/19* (2013.01); *H01L 24/20* (2013.01); *H01L 2224/95001* (2013.01)

(58) Field of Classification Search
CPC ....... H01L 21/561; H01L 24/19; H01L 24/20; H01L 2224/95001
See application file for complete search history.

(56) References Cited

U.S. PATENT DOCUMENTS

2012/0282767 A1* 11/2012 Jin ....................... H01L 21/568
257/E21.508

* cited by examiner

*Primary Examiner* — Mohammad M Choudhry
(74) *Attorney, Agent, or Firm* — Alston & Bird LLP

(57) ABSTRACT

The present disclosure provides a fan-out wafer-level packaging structure and a method for packaging the same. The structure includes: two or more semiconductor chips with a bonding pad, the semiconductor chips are arranged in a fan-out wafer array, and each of the semiconductor chips has an initial position, respectively; a plastic packaging layer, covering surfaces of the semiconductor chips and between the semiconductor chips, each of the semiconductor chips has an offset position, respectively, and the offset position has an offset distance relative to the initial position; a redistribution layer formed on the semiconductor chips, to realize interconnection between the semiconductor chips, the redistribution layer includes at least one first redistribution layer, the first redistribution layer is formed on a surface of the semiconductor chips and is aligned and in contact with the bonding pad of the semiconductor chips; and a metal bump formed on the redistribution layer.

6 Claims, 5 Drawing Sheets

FAN-OUT WAFER-LEVEL PACKAGING STRUCTURE AND METHOD PACKAGING THE SAME

CROSS REFERENCE TO RELATED APPLICATION

The present application claims the benefit of priority to Chinese Patent Application No. CN2020109369159, entitled "Fan-Out Wafer-Level Packaging Structure and Method Packaging the same", filed with CNIPA on Sep. 8, 2020, and Chinese Patent Application No. CN2020219435260, entitled "Fan-Out Wafer-Level Packaging Structure", filed with CNIPA on Sep. 8, 2020, the content of which is incorporated herein by reference in their entireties.

FIELD OF INVENTION

The present disclosure relates to the technical field of chip packaging, in particular, to a fan-out wafer-level packaging structure and a method packaging the same.

BACKGROUND

With the rapid development of the integrated circuit manufacturing industry, the requirements for integrated circuit packaging technology are increasing. Packaging methods include ball grid array (BGA) packaging, chip-size packaging (CSP), wafer-level packaging (WLP), three-dimensional (3D) packaging, and system-in-a-package (SiP), etc. Among them, wafer-level packaging (WLP) is gradually adopted by most chip manufacturers because of its outstanding advantages. In WLP, all or most of the process steps of WLP are completed on silicon wafers that have completed the previous processes. Finally, the wafer is directly cut into separate independent devices. WLP has the following unique advantages: 1) The packaging processing efficiency is high, and multiple wafers can be processed at the same time. 2) WLP has the advantages of flip-chip packaging, the products are light, thin, short, and small. 3) Compared with the previous processes, only two extra processes of redistribution layer (RDL) and bumping are added, while the rest are all traditional processes. 4) Multiple tests in traditional packaging are reduced. Therefore, many IC packaging companies worldwide have invested in the research, development, and production of WLP.

Fan-out wafer-level packaging has the advantages of miniaturization, low cost, and high integration, and has attracted high attention among manufacturers such as mobile device manufacturers. Fan-out wafer-level packaging is currently the most suitable for the highly demanding mobile/wireless device market, and it is also very attractive to other markets that focus on devices of high performance and small size.

In the traditional fan-out wafer-level packaging process, first, a semiconductor chip is generally bonded to an adhesive layer of a supporting substrate, and then a plastic packaging material is used as a plastic packaging layer. During the plastic packaging process, the plastic packaging material is heated to a liquid state and pressed at a high temperature. This process will cause the wafer to warp, generally, the wafer is warped upward at the center. FIG. 1 shows a flatness measurement of a 250 mm size wafer, having a warpage peak at >1500 um or 1.5 mm. When the entire wafer is warped, some of the semiconductor chips on the wafer will shift, thus, the pads on the semiconductor chip may misalign from the interconnections in the corresponding chips on the wafer. When the entire wafer is warped upwards, the semiconductor chip located at the edge of the wafer and the semiconductor chip located in the middle of the wafer will drift, and the offset of the semiconductor chip at the edge may be greater than that of the semiconductor chip in the middle. When the semiconductor chip drifts, the subsequent packaging process will be severely tested. For example, when the redistribution layer (RDL) is formed subsequently, due to the drift of the semiconductor chip, when the dielectric layer of the redistribution layer is formed by photolithography, the photolithography pattern cannot be accurately aligned with the semiconductor chip pad, which reduces the alignment accuracy of the entire redistribution layer, thus the yield of wafer packaging is affected.

SUMMARY

The embodiment of the present disclosure provides a method for packaging a fan-out wafer-level packaging structure. The method includes: providing a plurality of semiconductor chips each having a solder pad; bonding the plurality of semiconductor chips to an adhesive layer to form a fan-out wafer array, wherein the fan-out wafer array is divided into multiple semiconductor chip units, wherein each of the plurality of semiconductor chips has an initial position, respectively; forming a plastic packaging layer on the plurality of semiconductor chips, wherein each of the plurality of semiconductor chips has an offset position, wherein the offset position has an offset shift relative to the initial position; removing the adhesive layer, and forming a redistribution layer on the plurality of semiconductor chips, to realize interconnection between the plurality of semiconductor chips, wherein the redistribution layer includes at least one first redistribution layer, wherein a method for forming the first redistribution layer includes: forming a dielectric layer on the plurality of semiconductor chips; dividing the dielectric layer into multiple patterning areas, wherein each of the multiple patterning areas matches one of the multiple semiconductor chip units; depositing a photoresist layer on the dielectric layer; performing a photolithography alignment and exposure process separately in one of the multiple patterning areas, followed by an etching process to form through holes in the dielectric layer, wherein a shielding mask controls exposure to only one of the multiple patterning areas; readjusting and repeating the photolithography alignment and exposure process to a next one of the multiple patterning areas until everyone of the multiple patterning areas is exposed; and forming a patterned metal wiring layer on the dielectric layer and filling the through holes; and forming metal bumps on the redistribution layer.

In some examples, the method includes bonding the adhesive layer to a supporting substrate; and removing the supporting substrate and the adhesive layer simultaneously, followed by removing the redistribution layer.

In some examples, the redistribution layer further comprises a second redistribution layer formed on the first redistribution layer, wherein a method for forming the second redistribution layer comprises: forming a patterned dielectric layer on the first redistribution layer by a photolithography process to form through holes that expose the first redistribution layer; and forming a patterned metal wiring layer to align to the first redistribution layer.

Another embodiment provides a fan-out wafer-level packaging structure, comprising: a plurality of semiconductor chips with a bonding pad, wherein the plurality of semiconductor chips are arranged in a fan-out wafer array, and wherein each of the plurality of semiconductor chips has an initial position on the wafer, respectively; a plastic packaging layer, covering surfaces of the plurality of semiconductor chips and filled in spaces between the plurality of the semiconductor chips, wherein each of the plurality of semiconductor chips has an offset position, respectively, wherein the offset position has an offset shift relative to the initial position; a redistribution layer formed on the plurality of semiconductor chips, to realize interconnection between the plurality of semiconductor chips, wherein the redistribution layer comprises one first redistribution layer, and wherein the first redistribution layer is formed on a surface of one of the plurality of semiconductor chips; and wherein the first redistribution layer is aligned to and in contact with the bonding pad of the plurality of semiconductor chips; and a metal bump formed on the redistribution layer.

As described above, in the fan-out wafer-level packaging structure and the method for packaging the same, when forming the first redistribution layer, the fan-out wafer array is divided into multiple alignment areas through scribing units, and the areas are exposed separately one by one to form through holes that expose solder pads of the semiconductor chip. Each time the photolithography process is readjusted, which is equivalent to dividing one alignment and exposure step into multiple alignment and exposure steps, each alignment exposure adjusts the exposure according to the offset shifts and offset direction of the semiconductor chip of the areas where it is located, which effectively improves the alignment accuracy of the photolithography process when the redistribution layer is formed. Based on the high-precision photolithography alignment effect, the alignment accuracy of the subsequently formed redistribution layer can be effectively improved, thereby effectively improving the yield of wafer packaging. In addition, the method can be realized only by arranging a light shielding structure on the photolithography mask. The method is simple and feasible, and has strong operability.

DESCRIPTION OF REFERENCE NUMERALS

Figure 1:
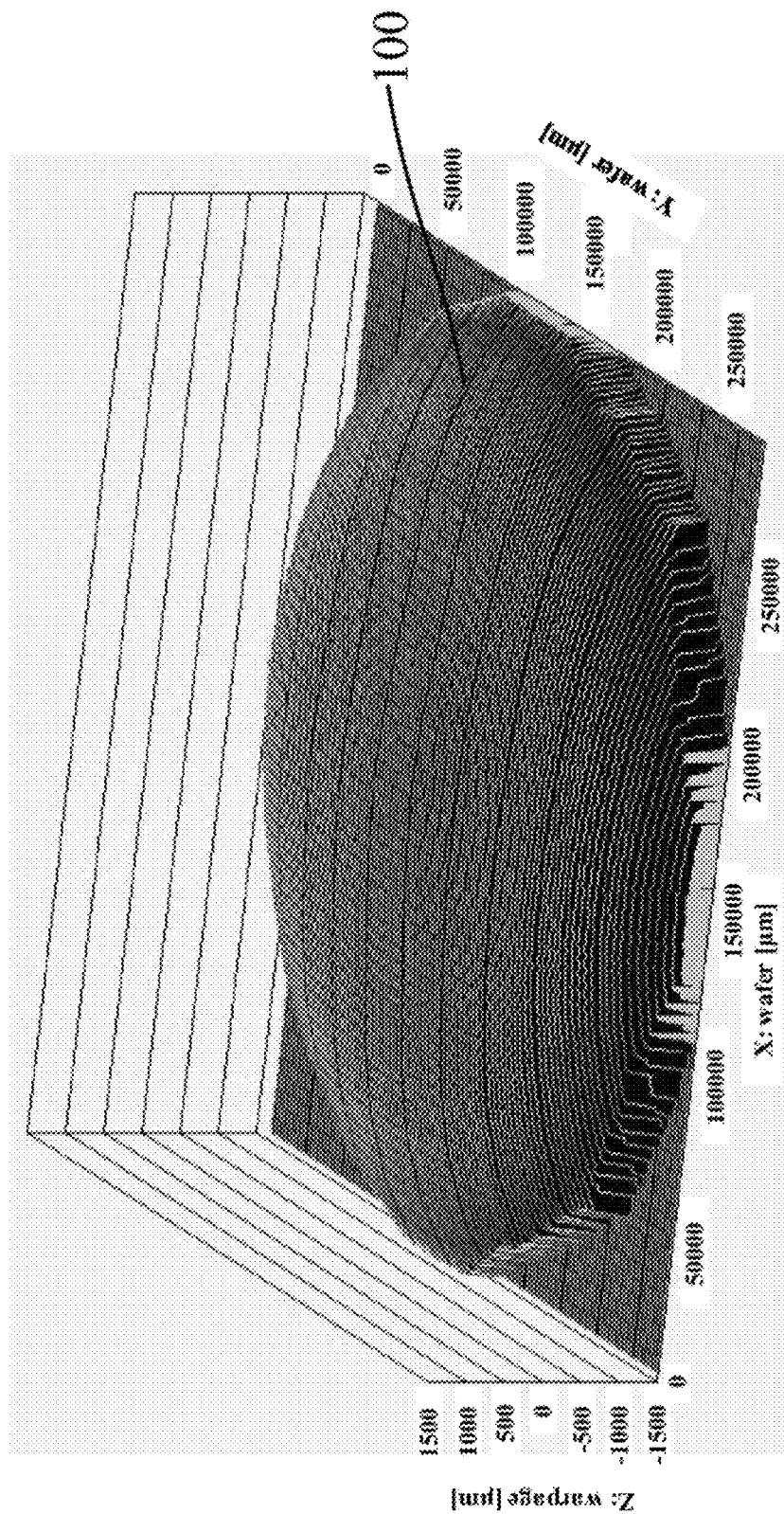
FIG. 1 shows a three-dimensional view of a wafer's warpage after the semiconductor chip is heated during packaging in the related arts.

100 Wafer
200 Semiconductor chip
201 Bonding pad
202 Adhesive layer
203 Fan-out wafer array
204 Semiconductor chip unit
205 Plastic packaging layer
206 Dielectric layer
207 Dielectric layer etching unit
208 Photoresist layer
209 Mask with shielding structure
210 Through hole
211 Patterned dielectric layer
212 Patterned metal wiring layer
213 First redistribution layer
214 Second redistribution layer
215 Redistribution layer
216 Metal bump
217 Supporting substrate

DESCRIPTION OF THE SPECIFIC EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Referring to FIGS. 2-17. It needs to be stated that the drawings provided in the following embodiments are just used for schematically describing the basic concept of the present disclosure, thus only illustrating components related to the present disclosure and are not drawn according to the numbers, shapes and sizes of components during actual implementation, the configuration, number and scale of each component during actual implementation thereof may be freely changed, and the component layout configuration thereof may be more complicated.

The present disclosure provides a method for packaging a fan-out wafer-level packaging structure. The method focuses on the subsequent process after the semiconductor chip is packaged by the plastic. When forming the first redistribution layer, the fan-out wafer array is divided into multiple etching units through scribing units, and the etching units are etched one by one to form through holes that expose solder pads of the semiconductor chip. Each time the etching unit is etched, the photolithography exposure step in the photolithography process is readjusted, which is equivalent to decomposing one alignment exposure into multiple alignment exposures, each alignment exposure adjusts the exposure direction according to the offset distance and offset direction of the semiconductor chip of the etching unit where it is located, which effectively improves the alignment accuracy of the photolithography process when the redistribution layer is formed. Based on the high-precision photolithography alignment effect, the alignment accuracy of the subsequently formed redistribution layer can be effectively improved, thereby effectively improving the yield of wafer packaging. In addition, the method can be realized only by arranging a light shielding structure on the photolithography mask. The method is simple and feasible, and has strong operability.

Figure 2:
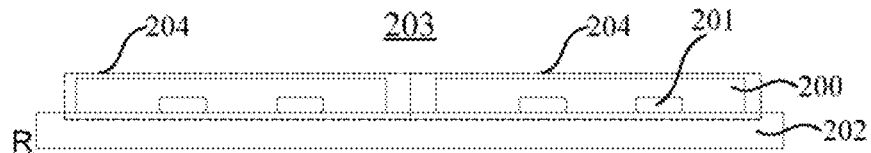
FIGS. 2 to 17 show schematic cross-sectional views of structures after each step of the method according to the embodiment in the present disclosure.
Figure 3:
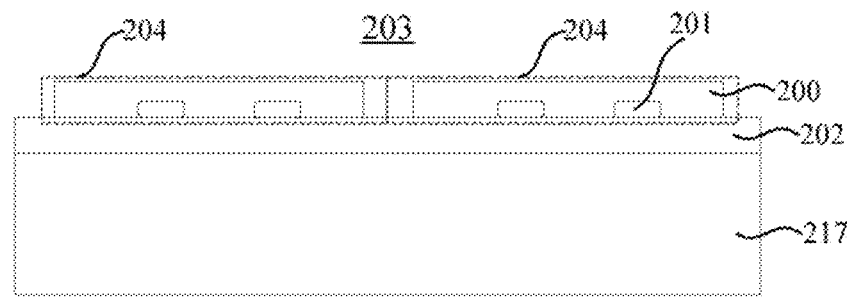

Referring to FIGS. 2-3, step 1) is performed, two or more semiconductor chips 200 with solder pads 201 are provided.

The semiconductor chip 200 may be any traditional semiconductor chip suitable for packaging, and may be an independent functional chip, such as a memory chip, a circuit chip, etc., or an integrated functional chip, such as an application processor unit (APU) chip, a graphics processing unit (GPU) chip, etc., which is not limited. The material of the solder pad 201 in the semiconductor chip 200 includes metallic aluminum. The solder pad 201 may be an aluminum solder pad. When preparing the solder pads 201, in order to improve the electrical properties of the solder pads and the adhesion with the semiconductor chip 200, an adhesive layer may be formed under the solder pads 201, and an anti-reflection layer may be formed on the solder pads 201.

Referring to FIGS. 2-3, step 2) is performed, the semiconductor chips 200 are bonded to the adhesive layer 202 to form a fan-out wafer array 203, the fan-out wafer array 203 is divided into two or more semiconductor chip units 204, and each of the semiconductor chips 200 has its own initial position.

It should be noted here that based on the requirements of packaging efficiency, packaging size, etc., in the fan-out wafer array 203, multiple semiconductor chips 200 may be bonded. In most cases, more than two semiconductor chips 200 are bonded, and the more semiconductor chips 200 are bonded, the more obvious the effect achieved by this embodiment. The number of solder pads 201 on the semiconductor chip 200 is not limited to two referring to the figure, and the specific number is set according to the specific semiconductor chip 200.

As an example, the number of the semiconductor chips 200 in each semiconductor chip unit 204 may be determined according to the maximum offset distance of the semiconductor chips 200 in the semiconductor chip unit 204 after subsequent plastic packaging of the semiconductor chip. The number of the semiconductor chip units 204 divided by the fan-out wafer array 203 is two or more, and the more the number is, the more obvious the effect achieved by this technique. In this embodiment, for ease of understanding, the semiconductor chips 200 arranged in a row in the figure is one semiconductor chip unit 204, so the semiconductor chip unit 204 in the cross-sectional view can only display one semiconductor chip 200, and two semiconductor chip units 204 in this arrangement in the figure will be described as an example.

Referring to FIG. 2, as an example, the semiconductor chip 200 is only adhered to the adhesive layer 202 to form the fan-out wafer array 203. This method has low cost, but the semiconductor chip 200 is more prone to warpage and drift after subsequent plastic packaging. The adhesive layer 202 may be a material such as a tape, a UV adhesive formed by spin coating, or an epoxy resin. In this embodiment, the adhesive layer 202 is a UV adhesive formed by spin coating. The UV adhesive will reduce the viscosity under ultraviolet light.

Referring to FIG. 3, as an example, the adhesive layer 202 is adhered to a supporting substrate 217, and the fan-out wafer array 203 is formed by the supporting substrate 217. The supporting substrate 217 may be a material such as glass, ceramic, metal, polymer, etc. In this embodiment, the supporting substrate 217 includes one of glass, a transparent semiconductor material, and a transparent polymer, so that the back surface of the supporting substrate 217 may be exposed to the aforementioned UV adhesive subsequently, which greatly simplifies the subsequent peeling process.

When the semiconductor chip 200 is adhered to the adhesive layer 202, the side of the semiconductor chip 200 with the solder pad 201 is adhered toward the adhesive layer. After the adhesive layer is subsequently removed and before the redistribution layer is formed, the semiconductor chip is turned upside down, so that the redistribution layer is formed on the semiconductor chip.

Figure 4:
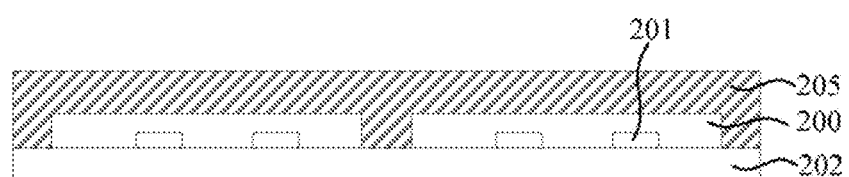
Figure 5:
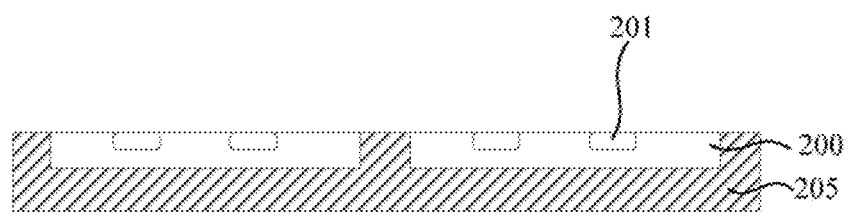

Referring to FIG. 4, step 3) is performed, the semiconductor chips 200 are packaged with a plastic packaging layer 205, each of the semiconductor chips 200 has its own offset position, and the offset position has an offset distance relative to the initial position. During plastic packaging, the plastic packaging material is heated to a liquid state and pressed under a high temperature environment. Since all the semiconductor chips 200 are a wafer array formed by re-bonding one by one, warping will occur under this pressing pressure, and the semiconductor chip 200 will drift, that is, the offset positions of the plastic packaged semiconductor chips 200 in the wafer array relative to the initial positions in the wafer array will have an offset distance, and because the positions of the semiconductor chips 200 in the wafer array are different, the offset directions and the offset degrees are also different, and accordingly, the solder pads on the semiconductor chip will also be offset.

As an example, the material of the plastic packaging layer 205 includes one of polyimide, silicone and epoxy resin. The plastic packaging layer 205 is added with additives to form an opaque material.

As an example, the processes used for plastic packaging of the semiconductor chip 200 include one of an injection molding process, a compression molding process, a printing process, a transfer molding process, a liquid sealant curing molding process, a vacuum lamination process, and a spin coating process. In this embodiment, each semiconductor chip 200 is plastic packaged through an injection molding process, and the plastic packaging layer 205 includes opaque silicone.

Referring to FIGS. 5-13, step 4) is performed, the adhesive layer 202 is removed (referring to FIG. 5), and a redistribution layer 215 is formed on the semiconductor chips 200 (referring to FIG. 17), to realize the interconnection between the semiconductor chips 200. The redistribution layer 215 includes at least one first redistribution layer 213 (in FIG. 11), and a method for forming the first redistribution layer 213 includes: forming a dielectric layer 206 on the semiconductor chip 200. An area corresponding to each semiconductor chip unit 204 is taken as a dielectric layer etching unit 207, correspondingly, the dielectric layer 206 is divided into two or more dielectric layer etching units 207, and the dielectric layer etching units 207 are exposed separately one by one by the photolithography process (referring to FIGS. 8-10) to form through holes 210 in the dielectric layer 206 that expose the solder pads 201 of each semiconductor chip 200. The photolithography exposure step is readjusted every time the dielectric layer etching unit 207 is exposed. After the photoresist is developed and cleaned, an etch step follows. A patterned metal wiring layer 212 is formed on the dielectric layer 206 and filled in the through hole 210 (referring to FIG. 11).

When forming the first redistribution layer 213, the fan-out wafer array 203 is divided into multiple etching units through scribing units, and the dielectric layer etching units 207 are exposed separately side by side to form through holes that expose solder pads of the semiconductor chip. Each time one etching unit is etched, the photolithography exposure step is readjusted, which is equivalent to separating one alignment and exposure step into multiple alignment and exposure steps, each alignment and exposure step adjusts the exposure position according to the offset distance and offset direction of the semiconductor chip of the etching unit where it is located, which effectively improves the alignment accuracy of the photolithography process when the redistribution layer is formed. Based on the high-precision photolithography alignment capability, the alignment accuracy of the subsequently formed redistribution layer can be effectively improved, thereby effectively improving the yield of wafer packaging. In addition, the method can be realized only by arranging a light shielding structure on the photolithography mask. The method is simple and feasible, and has strong operability.

When the fan-out wafer array 203 is formed by the adhesive layer 202 and the supporting substrate 217, the supporting substrate 217 is also removed when the adhesive layer 202 is removed.

Figure 6:
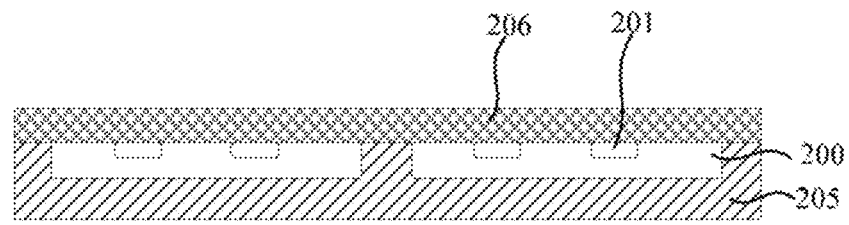

Referring to FIGS. 6-11, as an example, when the material of the dielectric layer 206 includes one or a combination of epoxy resin, silicone, benzocyclobutene (BCB), silicon oxide, phosphosilicate glass, and fluorine-containing glass, the method for forming the first redistribution layer 213 includes:

Referring to FIG. 6, a dielectric layer 206 is formed on the semiconductor chip 200. The dielectric layer 206 may be formed by a chemical vapor deposition process or a physical vapor deposition process.

Figure 7:
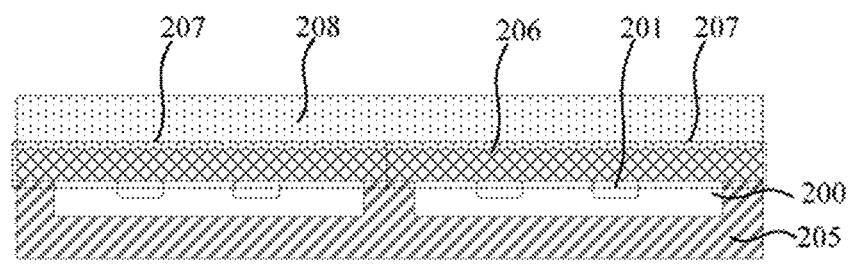

Referring to FIG. 7, a photoresist layer 208 is coated on the dielectric layer 206.

Figure 8:
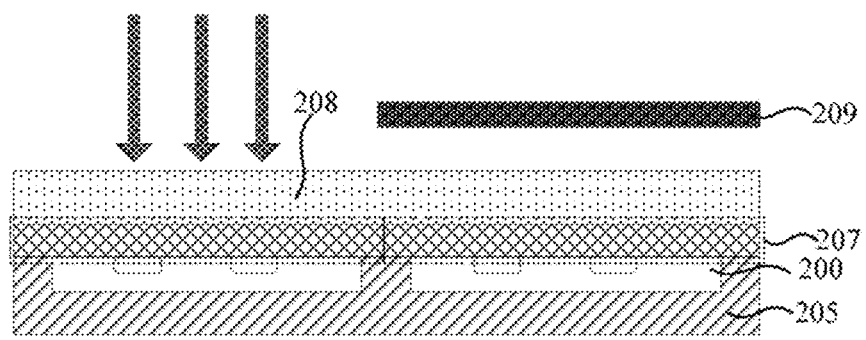

Referring to FIG. 8, the photoresist layer 208 is exposed using a mask with a shielding structure 209, so that only the photoresist layer 208 on the dielectric layer etching unit 207 on the left is exposed first. This is followed by a resist develop and ash process, to form an etching window, then the dielectric layer 206 is etched through the etching window in an etching process to form through holes 210 in the dielectric layer etching unit 207 on the left only. As a result, the through holes 210 expose the solder pads 201 on the semiconductor chip 200 in the semiconductor chip unit 204 on the left as shown in FIG. 9.

Figure 9:
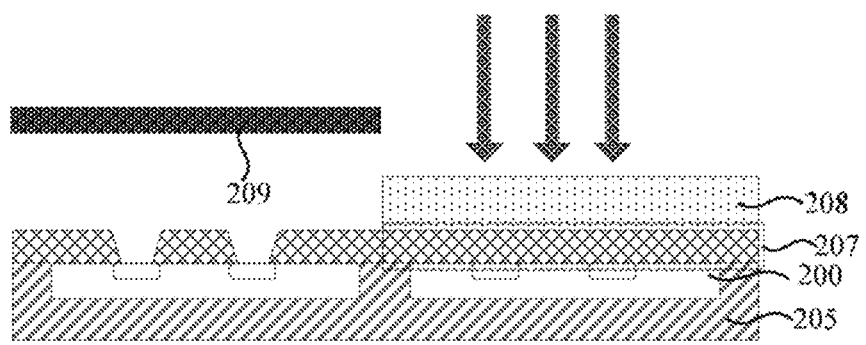
Figure 10:
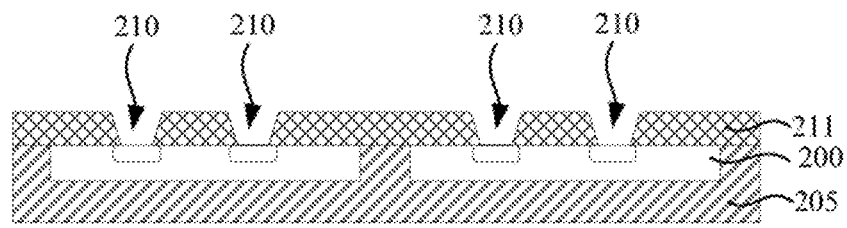

Referring to FIG. 9, the relative position between the mask with the shielding structure 209 and the dielectric layer etching unit 207 is then adjusted, the photoresist layer 208 is exposed using the mask \ shielding structure 209, so that only the photoresist layer 208 on the dielectric layer etching unit 207 on the right side is exposed this time. This is followed by a resist develop and ash process to form the etching window on the right, and the dielectric layer 206 is etched through the etching window in an etching process to form through holes 210 in the dielectric layer etching unit 207 on the right, and the through holes 210 expose the solder pads 201 on the semiconductor chip 200 in the semiconductor chip unit 204 on the right. During the left and right exposures, alignment procedures guide the photolithography exposure at the correct locations so the exposures are more accurate. After the photoresist layer is developed and cleaned off after ashing in either left or right, an etching process takes place on opening the through holes to connect to the solder pads 201 on the semiconductor chip 200 on both left and right sides.

In this example, two dielectric layer etching units 207 are taken as an example, there may be more than two dielectric layer etching units 207 in practice. At this time, continue this step until the dielectric layer 206 is completely patterned to form a patterned dielectric layer 211 (referring to FIG. 10).

Figure 11:
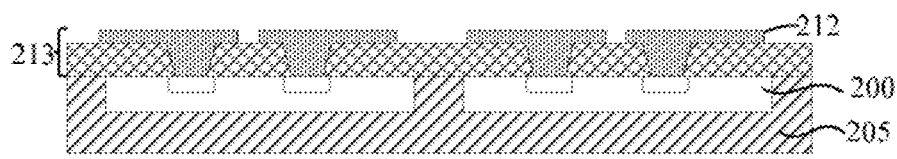

Referring to FIG. 11, finally, a metal wiring layer is formed on the surface of the patterned dielectric layer 211 and filling the through holes 210 by applying a chemical vapor deposition process, a physical vapor deposition process, a sputtering process, an electroplating process, or an electroless plating process. The metal wiring layer is patterned into metal wiring layer 212. A material of the metal wiring layer includes one or an alloy of copper, aluminum, nickel, gold, silver, and titanium.

Figure 12:
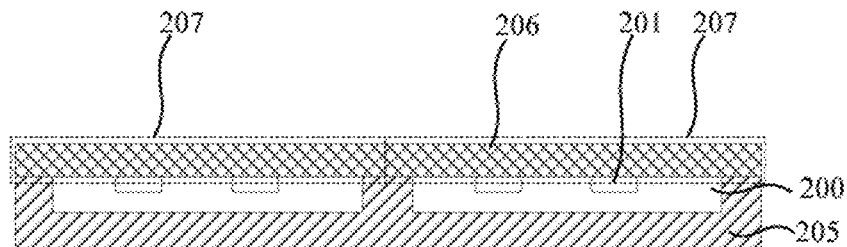

Referring to FIGS. 11-14, as an example, when a material of the dielectric layer 206 includes one or a combination of polyimide (PI) and polybenzoxazole (PBO), the method of forming the first redistribution layer 213 includes:

Referring to FIG. 12, a dielectric layer 206 is formed on the semiconductor chip 200.

Figure 13:
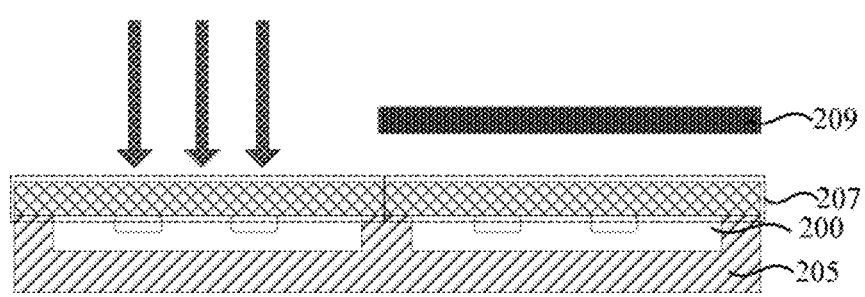

Referring to FIG. 13, a photolithography process is directly applied to the dielectric layer 206. Specifically, the photoresist layer 208 is exposed with the mask shielding structure 209, so that only the photoresist layer 208 on the dielectric layer etching unit 207 on the left is exposed first. This is followed by a resist develop and ash process, to form an etching window, then the dielectric layer 206 is etched through the etching window in an etching process to form through holes 210 in the dielectric layer etching unit 207 on the left only. As a result, the through holes 210 expose the solder pads 201 on the semiconductor chip 200 in the semiconductor chip unit 204 on the left.

Figure 14:
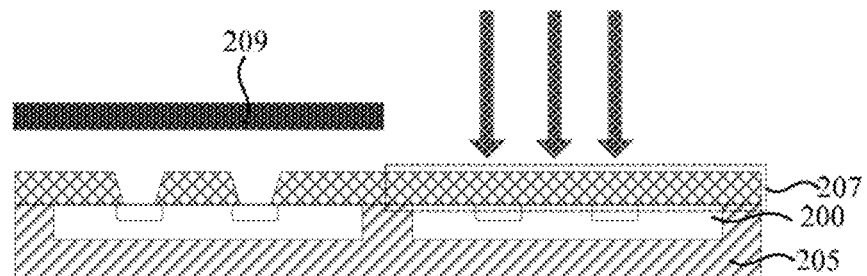

Referring to FIG. 14, the step between the mask shielding structure 209 and the dielectric layer etching unit 207 is then adjusted, only the photoresist layer 208 on the dielectric layer etching unit 207 on the right is exposed this time. This is followed by a resist develop and ash process, to form a right etching window, then the dielectric layer 206 is etched through the etching window in an etching process to form through holes 210 in the dielectric layer etching unit 207 on the right only. As a result, the through holes 210 expose the solder pads 201 on the semiconductor chip 200 in the semiconductor chip unit 204 on the right this time.

During the left and right exposures, alignment procedures guide the photolithography exposure at the correct locations so the exposures are more accurate at each side. After the photoresist layer is developed and cleaned off, etching takes place on opening the through holes to connect to the solder pads 201 on the semiconductor chip 200 on both left and right sides. In this example, two dielectric layer etching units 207 are taken as an example, there may be more than two dielectric layer etching units 207 in practice. At this time, continue this step until the dielectric layer 206 is completely patterned to form a patterned dielectric layer 211 (referring to FIG. 10). Referring to FIG. 11, finally, a metal wiring layer is deposited on the surface of the patterned dielectric layer 211, and then filled in the through holes 210 by applying a chemical vapor deposition process, a physical vapor deposition process, a sputtering process, an electroplating process, or an electroless plating process. The metal wiring layer is etched to form a patterned metal wiring layer 212. A material of the metal wiring layer includes one or alloy of copper, aluminum, nickel, gold, silver, and titanium.

Figure 15:
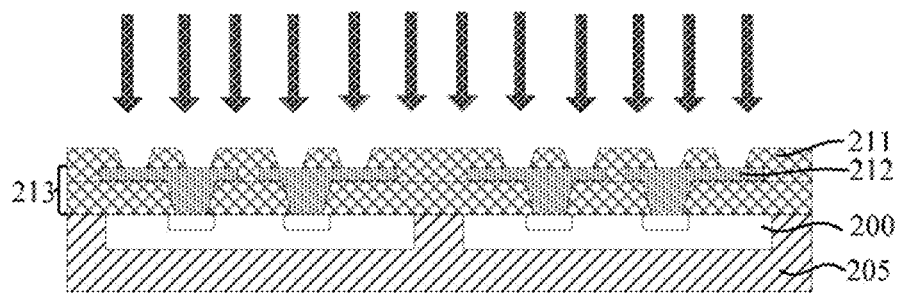
Figure 16:
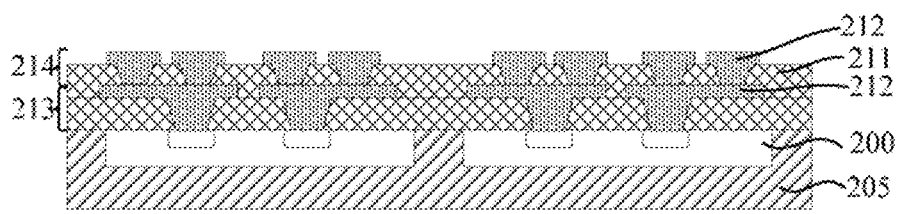

Referring to FIGS. 15-16, as an example, the redistribution layer 215 further includes at least one second redistribution layer 214 formed on the first redistribution layer 213, and a method for forming the second redistribution layer 214 includes: forming a dielectric layer 206 on the first redistribution layer 213. The dielectric layer 206 is processed by a photolithography and etching process to form a patterned dielectric layer 211 (referring to FIG. 15), to form through holes in the patterned dielectric layer 211 that exposes the underneath patterned metal wiring layer 212. A patterned metal wiring layer 212 is formed containing the through holes and the patterned dielectric layer 211 (referring to FIG. 16).

Figure 17:
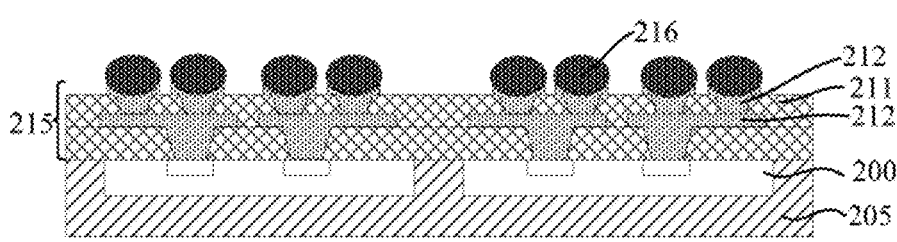

Referring to FIG. 17, step 5) is finally performed, metal bumps 216 are formed on the redistribution layer 215.

As an example, the material of each of the metal bumps 216 includes one of a gold-tin solder ball, a silver-tin solder ball, and a copper-tin solder ball, or the metal bump 216 includes a metal pillar and a solder ball formed on the metal pillar. Preferably, the metal pillars are copper pillars or nickel pillars. In this embodiment, the metal bumps 216 are gold-tin solder balls, and a method for manufacturing the metal bump 216 includes: forming a gold-tin layer on a surface of the redistribution layer 215, reflowing the gold-tin layer into spherical using a high-temperature reflow process, and forming a gold-tin solder ball after cooling; or forming the gold tin solder ball using a ball planting process.

Referring to FIG. 17, this embodiment further provides a fan-out wafer-level packaging structure. The fan-out wafer-level packaging structure may be prepared by the method for packaging the fan-out wafer-level packaging structure of the foregoing embodiment. Referring to the method in the above embodiment for the beneficial effects that the fan-out wafer-level packaging structure can achieve, which will not be described in detail below. The packaging structure includes: two or more semiconductor chips 200 with bonding pads 201 are arranged in a fan-out wafer array 203, and each semiconductor chip 200 has its own initial position; a plastic packaging layer 205 disposed on the top surfaces and side surfaces of the semiconductor chips 200, as well as any space between the semiconductor chips 200, each of the semiconductor chips 200 has its own offset position, and the offset position has an offset shifts relative to the initial position; a redistribution layer 215 formed on the semiconductor chips 200, to realize interconnection between the semiconductor chips 200, the redistribution layer 215 includes at least one first redistribution layer 213, the first redistribution layer 213 is formed on surfaces of the semiconductor chips 200 and is aligned and in contact with the bonding pads 201 of the semiconductor chips 200; metal bumps 216 formed on the redistribution layer 215.

As an example, the redistribution layer 215 includes a patterned dielectric layer 211 and a patterned metal wiring layer 212. Preferably, a material of the patterned dielectric layer 211 includes one or a combination of two or more of epoxy resin, silicone, PI, PBO, BCB, silicon oxide, phosphosilicate glass, and fluorine-containing glass. A material of the patterned metal wiring layer 212 includes one or a combination of two or more of copper, aluminum, nickel, gold, silver, and titanium.

As an example, the material of the plastic packaging layer 205 includes one of polyimide, silicone and epoxy resin.

In summary, this embodiment provides a fan-out wafer-level packaging structure and a method for packaging the same. When forming the first redistribution layer, the fan-out wafer array is divided into multiple etching units through scribing units, and the etching units are exposed separately one by one in the photolithography process with separate alignment procedures to form through holes that expose solder pads of the semiconductor chip. Each time one etching unit is etched, the photolithography exposure step is readjusted, which is equivalent to dividing one alignment and exposure step into multiple alignment and exposure steps, each alignment and exposure step adjusts the alignment before exposure according to the offset shift of the semiconductor chip of the etching unit where it is located, which effectively improves the alignment accuracy of the photolithography process when the redistribution layer is formed. Based on the high-precision photolithography alignment effect, the alignment accuracy of the subsequently formed redistribution layer can be effectively improved, thereby effectively improving the yield of wafer packaging. In addition, the method can be realized only by arranging a light shielding structure on the photolithography mask. The method is simple and feasible, and has strong operability. Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

The invention claimed is:

1. A method for packaging a fan-out wafer-level packaging structure, comprising:
   providing a plurality of semiconductor chips each having a solder pad;
   bonding the plurality of semiconductor chips to an adhesive layer to form a fan-out wafer array, wherein the fan-out wafer array is divided into multiple semiconductor chip units, wherein each of the plurality of semiconductor chips has an initial position, respectively;
   forming a plastic packaging layer on the plurality of semiconductor chips, wherein each of the plurality of semiconductor chips has an offset position, wherein the offset position has an offset shift relative to the initial position;
   removing the adhesive layer, and forming a redistribution layer on the plurality of semiconductor chips, to realize interconnection between the plurality of semiconductor chips, wherein the redistribution layer includes at least one first redistribution layer, wherein a method for forming the first redistribution layer includes:
      forming a dielectric layer on the plurality of semiconductor chips;
      dividing the dielectric layer into multiple patterning areas, wherein each of the multiple patterning areas matches one of the multiple semiconductor chip units;
      depositing a photoresist layer on the dielectric layer;
      performing a photolithography alignment and exposure process separately in one of the multiple patterning areas, followed by an etching process to form through holes in the dielectric layer, wherein a shielding mask controls exposure to only one of the multiple patterning areas;
      readjusting and repeating the photolithography alignment and exposure process to a next one of the multiple patterning areas until everyone of the multiple patterning areas is exposed; and
      forming a patterned metal wiring layer on the dielectric layer and filling the through holes; and
   forming metal bumps on the redistribution layer.

2. The method for packaging a fan-out wafer-level packaging structure according to claim 1, further comprising:
   bonding the adhesive layer to a supporting substrate; and
   removing the supporting substrate and the adhesive layer simultaneously, followed by removing the redistribution layer.

3. The method for packaging a fan-out wafer-level packaging structure according to claim 1, wherein the redistribution layer further comprises a second redistribution layer formed on the first redistribution layer, wherein a method for forming the second redistribution layer comprises:
   forming a patterned dielectric layer on the first redistribution layer by a photolithography process to form through holes that expose the first redistribution layer; and
   forming a patterned metal wiring layer to align to the first redistribution layer.

4. The method for packaging a fan-out wafer-level packaging structure according to claim 1, wherein the adhesive layer comprises one of an adhesive tape, an adhesive made by a spin coating process, or an epoxy resin.

5. The method for packaging a fan-out wafer-level packaging structure according to claim 1, wherein a material of the plastic packaging layer includes one of polyimide, silicone, and epoxy resin.

6. The method for packaging a fan-out wafer-level packaging structure according to claim 1, wherein
- a material of the dielectric layer includes one or a combination of epoxy resin, silicone, PI, PBO, BCB, silicon oxide, phosphosilicate glass, and fluorine-containing glass; and
- a material of the metal wiring layer includes one or an alloy of copper, aluminum, nickel, gold, silver, and titanium.

* * * * *